(12) United States Patent
Lo et al.

(10) Patent No.: US 8,334,594 B2
(45) Date of Patent: Dec. 18, 2012

(54) CHIP HAVING A METAL PILLAR STRUCTURE

(75) Inventors: Jian-Wen Lo, Kaohsiung (TW); Chien-Fan Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 71 days.

(21) Appl. No.: 12/856,403

(22) Filed: Aug. 13, 2010

(65) Prior Publication Data
US 2011/0084381 A1    Apr. 14, 2011

(30) Foreign Application Priority Data
Oct. 14, 2009    (TW) .............................. 98134806 A (51) Int. Cl.
*H01L 23/48* (2006.01)
(52) U.S. Cl. ........ 257/737; 257/738; 257/770; 438/612; 438/613
(58) Field of Classification Search ............ 257/737, 257/738, 770, E23.021; 438/612, 613, 614, 438/678
See application file for complete search history.

(56) References Cited

U.S. PATENT DOCUMENTS

| | | |
|---|---|---|
| 3,761,309 A | 9/1973 | Schmitter et al. |
| 4,341,594 A | 7/1982 | Carlson et al. |
| 4,845,542 A | 7/1989 | Bezuk et al. |
| 5,466,635 A | 11/1995 | Lynch et al. |
| 5,629,564 A | 5/1997 | Nye, III et al. |
| 5,640,052 A | 6/1997 | Tsukamoto |
| 5,656,858 A * | 8/1997 | Kondo et al. ................. 257/737 |
| 5,698,465 A | 12/1997 | Lynch et al. |
| 5,790,377 A | 8/1998 | Schreiber et al. |
| 5,872,404 A | 2/1999 | Lynch et al. |

(Continued)

FOREIGN PATENT DOCUMENTS

JP    54128669    10/1979
(Continued)

OTHER PUBLICATIONS

Lo et al., U.S. Appl. No. 12/790,090, filed May 28, 2010 for "Semiconductor Device."

*Primary Examiner* — Howard Weiss
*Assistant Examiner* — Steven Rao
(74) *Attorney, Agent, or Firm* — Foley & Lardner LLP (57) ABSTRACT

The present invention relates to a chip having a metal pillar structure. The chip includes a chip body, at least one chip pad, a first passivation layer, an under ball metal layer and at least one metal pillar structure. The chip body has an active surface. The chip pad is disposed on the active surface. The first passivation layer is disposed on the active surface, and has at least one first opening so as to expose part of the chip pad. The under ball metal layer is disposed on the chip pad. The metal pillar structure is disposed on the under ball metal layer, and includes a metal pillar and a solder. The metal pillar is disposed on the under ball metal layer. The solder is disposed on the metal pillar, and the maximum diameter formed by the solder is shorter than or equal to the diameter of the metal pillar. Therefore, when the pitch between two adjacent metal pillar structures of the chip is a fine pitch, the defect of solder bridge can be avoided, so that the yield rate is improved.

20 Claims, 10 Drawing Sheets

U.S. PATENT DOCUMENTS

| | | | |
|---|---|---|---|
| 5,914,536 A | 6/1999 | Shizuki et al. |
| 5,943,597 A | 8/1999 | Kleffner et al. |
| 6,013,571 A | 1/2000 | Morrell |
| 6,028,357 A | 2/2000 | Moriyama |
| 6,051,450 A | 4/2000 | Ohsawa et al. |
| 6,077,765 A | 6/2000 | Naya |
| 6,107,164 A | 8/2000 | Ohuchi |
| 6,159,837 A | 12/2000 | Yamaji et al. |
| 6,229,220 B1 | 5/2001 | Saitoh et al. |
| 6,281,106 B1 | 8/2001 | Higdon et al. |
| 6,350,705 B1 | 2/2002 | Lin |
| 6,362,087 B1 | 3/2002 | Wang et al. |
| 6,362,090 B1 | 3/2002 | Paik et al. |
| 6,378,759 B1 | 4/2002 | Ho et al. |
| 6,501,185 B1 | 12/2002 | Chow et al. |
| 6,510,976 B2 | 1/2003 | Hwee et al. |
| 6,550,666 B2 | 4/2003 | Chew et al. |
| 6,573,598 B2 | 6/2003 | Ohuchi et al. |
| 6,578,754 B1 | 6/2003 | Tung |
| 6,592,019 B2 | 7/2003 | Tung |
| 6,599,775 B2 | 7/2003 | Tie et al. |
| 6,600,234 B2 | 7/2003 | Kuwabara et al. |
| 6,639,299 B2 | 10/2003 | Aoki |
| 6,642,136 B1 | 11/2003 | Lee et al. |
| 6,664,128 B2 | 12/2003 | Tong et al. |
| 6,681,982 B2 | 1/2004 | Tung |
| 6,683,375 B2 | 1/2004 | Joshi et al. |
| 6,731,003 B2 | 5/2004 | Joshi et al. |
| 6,732,913 B2 | 5/2004 | Alvarez |
| 6,734,039 B2 | 5/2004 | Hwee et al. |
| 6,740,577 B2 * | 5/2004 | Jin et al. ........................ 438/612 |
| 6,750,082 B2 | 6/2004 | Briar et al. |
| 6,756,671 B2 * | 6/2004 | Lee et al. ...................... 257/737 |
| 6,784,087 B2 | 8/2004 | Lee et al. |
| 6,818,545 B2 | 11/2004 | Lee et al. |
| 6,888,209 B2 | 5/2005 | Jobetto |
| 6,917,119 B2 | 7/2005 | Lee et al. |
| 6,929,981 B2 | 8/2005 | Hwee et al. |
| 6,940,168 B2 * | 9/2005 | Garrity et al. .................. 257/738 |
| 7,008,867 B2 | 3/2006 | Lei |
| 7,022,548 B2 | 4/2006 | Joshi et al. |
| 7,087,458 B2 | 8/2006 | Wang et al. |
| 7,122,403 B2 | 10/2006 | Chandran et al. |
| 7,135,770 B2 | 11/2006 | Nishiyama et al. |
| 7,268,438 B2 | 9/2007 | Nishiyama et al. |
| 7,276,801 B2 | 10/2007 | Dubin et al. |
| 7,391,112 B2 | 6/2008 | Li et al. |
| 7,449,406 B2 | 11/2008 | Nishiyama et al. |
| 7,456,496 B2 | 11/2008 | Hwee et al. |
| 7,476,564 B2 | 1/2009 | Chen et al. |
| 7,550,375 B2 | 6/2009 | Wang et al. |
| 2002/0011664 A1 | 1/2002 | Tanaka |
| 2003/0127734 A1 | 7/2003 | Lee et al. |
| 2003/0219966 A1 * | 11/2003 | Jin et al. ........................ 438/612 |
| 2006/0006544 A1 | 1/2006 | Farrar |
| 2008/0296761 A1 | 12/2008 | Lee et al. |
| 2009/0072385 A1 | 3/2009 | Alley et al. |
| 2009/0155955 A1 | 6/2009 | Liang |
| 2009/0289360 A1 | 11/2009 | Takahashi et al. |
| 2011/0084389 A1 | 4/2011 | Lo et al. |

FOREIGN PATENT DOCUMENTS

| | | |
|---|---|---|
| JP | 60217646 | 10/1985 |
| JP | 62160744 | 7/1987 |
| JP | 1123440 | 5/1989 |
| JP | 4144143 | 5/1992 |
| JP | 5109820 | 4/1993 |
| JP | 5152376 | 6/1993 |
| JP | 5315339 | 11/1993 |
| JP | 2711722 | 8/1995 |
| JP | 7335648 | 12/1995 |
| JP | 8008259 | 1/1996 |
| JP | 8013166 | 1/1996 |
| JP | 9266230 | 10/1997 |
| JP | 9045691 | 12/1997 |
| JP | 2000091371 | 3/2000 |
| JP | 2000269387 | 9/2000 |
| JP | 2002043352 | 2/2002 |
| JP | 2006279062 | 10/2006 |
| JP | 2008047667 | 2/2008 |

* cited by examiner

CHIP HAVING A METAL PILLAR STRUCTURE

BACKGROUND OF THE INVENTION

1. Field of the Invention

The present invention relates to a chip, and more particularly to a chip having a metal pillar structure.

2. Description of the Related Art

Figure 1:
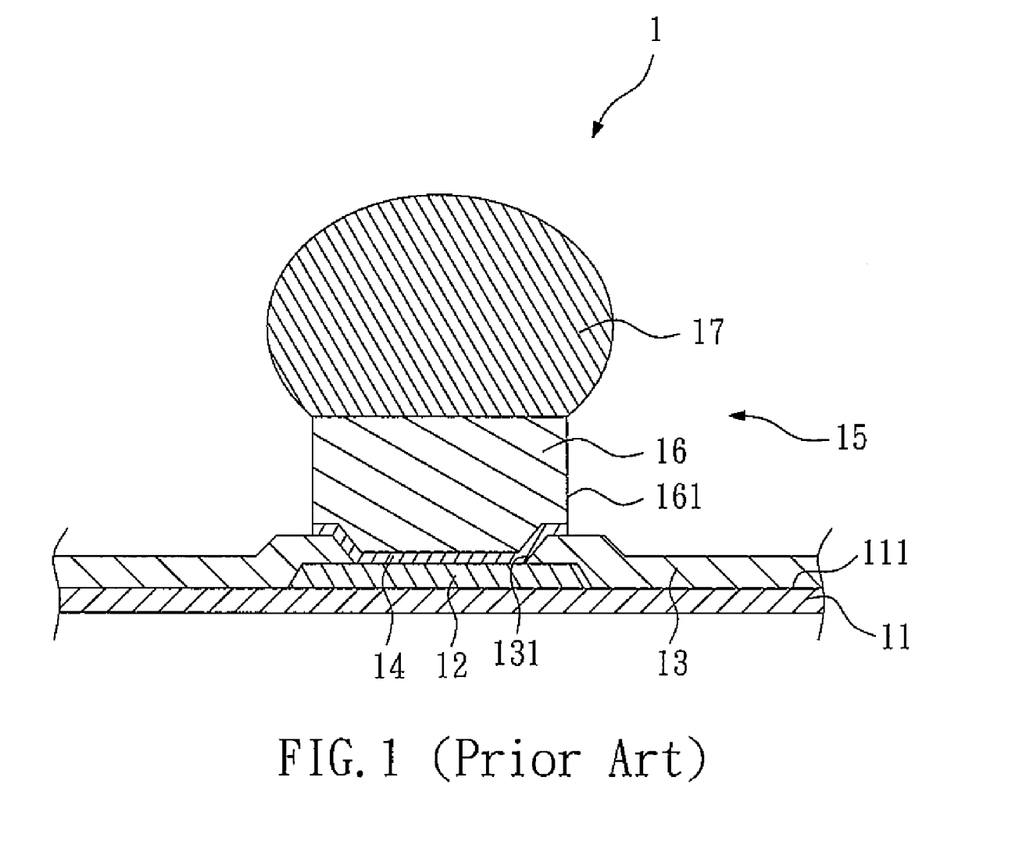
FIG. 1 is a cross-sectional view of a conventional chip having a metal pillar structure.

FIG. 1 shows a cross-sectional view of a conventional chip having a metal pillar structure. The conventional chip 1 having a metal pillar structure comprises a chip body 11, at least one chip pad 12, a first passivation layer 13, an under ball metal layer (UBM) 14 and at least one metal pillar structure 15. The chip body 11 has an active surface 111. The chip pad 12 is disposed on the active surface 111. The first passivation layer 13 is disposed on the active surface 111, and has at least one first opening 131 so as to expose part of the chip pad 12. The under ball metal layer (UBM) 14 is disposed on the chip pad 12. The metal pillar structure 15 is disposed on the under ball metal layer (UBM) 14, and comprises a metal pillar 16 and a solder 17. The metal pillar 16 is disposed on the under ball metal layer (UBM) 14, and has a peripheral surface 161. The solder 17 is disposed on the metal pillar 16, and the maximum diameter formed by the solder 17 is greater than the diameter of the metal pillar 16, so that the solder 17 protrudes outside of a phantom zone extending upward from the peripheral surface 161 of the metal pillar 16.

The conventional chip 1 has the following disadvantages. When the pitch between two adjacent metal pillar structures 15 of the chip 1 is a fine pitch, and the maximum diameter formed by the solder 17 is greater than the diameter of the metal pillar 16, a solder bridge easily happens, which leads to a short circuit.

Therefore, it is necessary to provide a chip having a metal pillar structure to solve the above-mentioned problems.

SUMMARY OF THE INVENTION

The present invention is directed to a chip having a metal pillar structure. The chip comprises a chip body, at least one chip pad, a first passivation layer, an under ball metal layer (UBM) and at least one metal pillar structure. The chip body has an active surface. The chip pad is disposed on the active surface. The first passivation layer is disposed on the active surface, and has at least one first opening so as to expose part of the chip pad. The under ball metal layer (UBM) is disposed on the chip pad. The metal pillar structure is disposed on the under ball metal layer (UBM), and comprises a metal pillar and a solder. The metal pillar is disposed on the under ball metal layer (UBM). The solder is disposed on the metal pillar, and the maximum diameter formed by the solder is shorter than or equal to the diameter of the metal pillar.

The present invention is further directed to a chip having a metal pillar structure. The chip comprises a chip body, at least one chip pad, a first passivation layer, an under ball metal layer (UBM) and at least one metal pillar structure. The chip body has an active surface. The chip pad is disposed on the active surface. The first passivation layer is disposed on the active surface, and has at least one first opening so as to expose part of the chip pad. The under ball metal layer (UBM) is disposed on the chip pad. The metal pillar structure is disposed on the under ball metal layer (UBM), and comprises a metal pillar and a solder. The metal pillar is disposed on the under ball metal layer (UBM), and has a metal pillar. The solder is disposed in a phantom zone extending upward from the peripheral surface of the metal pillar.

Whereby, when the pitch between two adjacent metal pillar structures of the chip is a fine pitch, the defect of solder bridge can be avoided, so that the yield rate is improved.

DETAILED DESCRIPTION OF THE INVENTION

Figure 2:
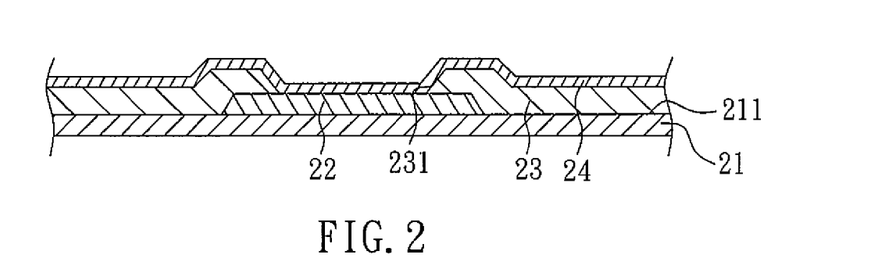
FIGS. 2 to 8 are schematic views of a method for making a chip having a metal pillar structure according to a first embodiment of the present invention.
Figure 3:
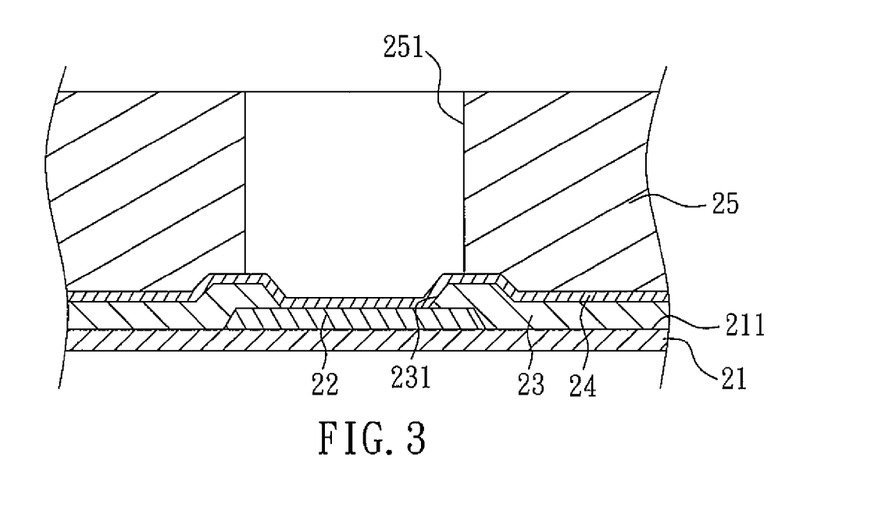

FIGS. 2 to 8 show schematic views of a method for making a chip having a metal pillar structure according to a first embodiment of the present invention. As shown in FIG. 2, a chip body 21, at least one chip pad 22, a first passivation layer 23 and a sputtering layer 24 are provided. The chip body 21 has an active surface 211. The chip pad 22 is disposed on the active surface 211. The first passivation layer 23 is disposed on the active surface 211, and has at least one first opening 231 so as to expose part of the chip pad 22. The sputtering layer 24 covers the first passivation layer 23 and part of the chip pad 22. As shown in FIG. 3, a photoresist 25 is formed on the sputtering layer 24. The photoresist 25 has at least one photoresist opening 251. The photoresist opening 251 exposes part of the sputtering layer 24, and the position of the photoresist opening 251 corresponds to the chip pad 22.

Figure 4:
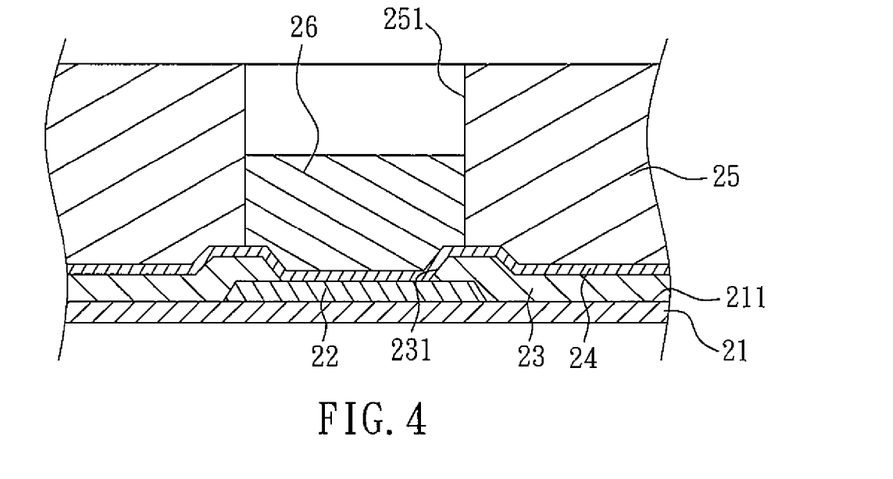
Figure 5:
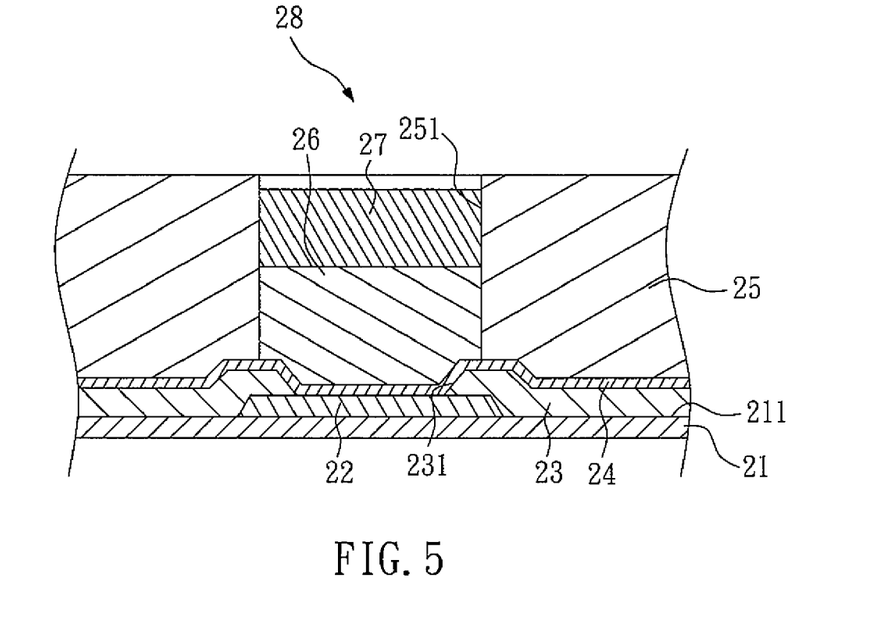

As shown in FIG. 4, a metal pillar 26 is formed in the photoresist opening 251. The metal pillar 26 is disposed on the sputtering layer 24, the material of the metal pillar 26 is preferably copper (Cu), and the height of the metal pillar 26 has no limitation. As shown in FIG. 5, a solder 27 is formed in the photoresist opening 251. The solder 27 is disposed on the metal pillar 26, and therefore, the metal pillar 26 and the solder 27 form a metal pillar structure 28.

Figure 6:
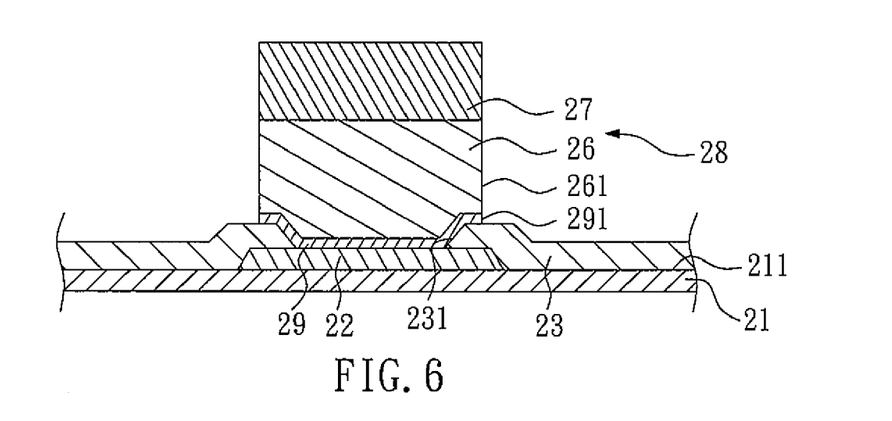
Figure 7:
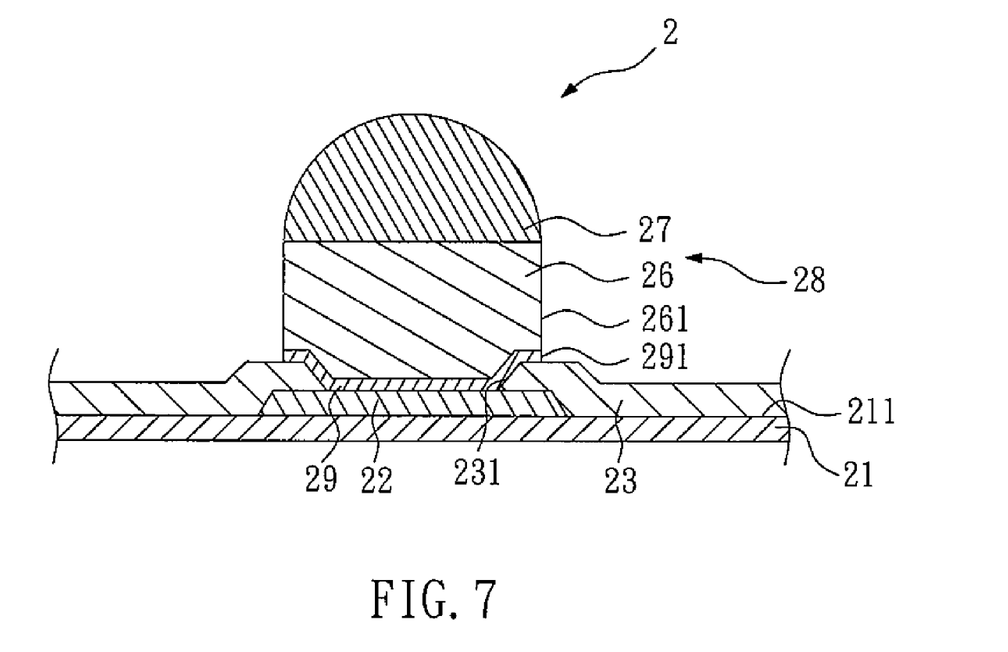
Figure 8:
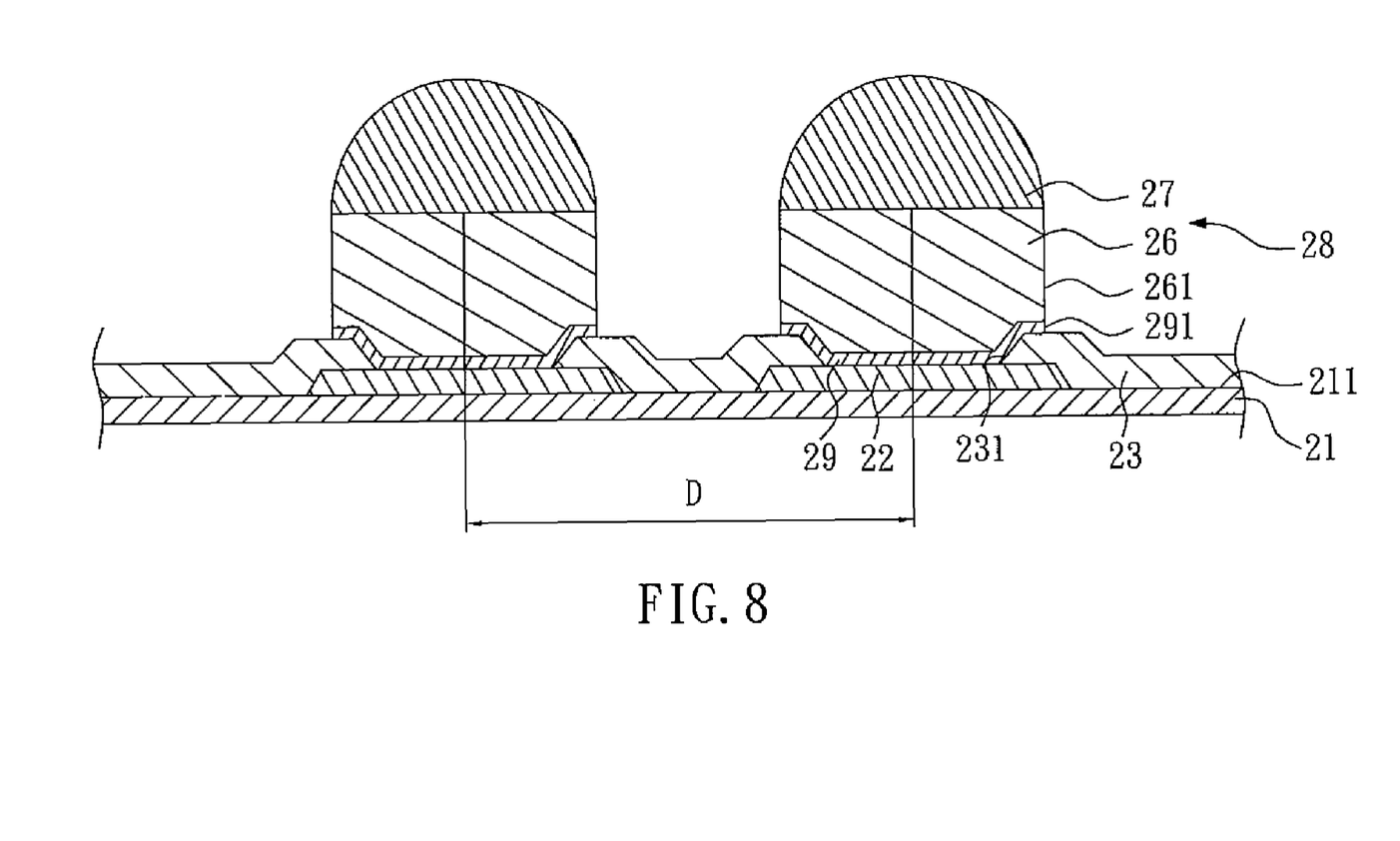

As shown in FIG. 6, the photoresist 25 (FIG. 5) is removed by a photoresist stripper, and part of the sputtering layer 24 (FIG. 5) is removed by etching, so as to form an under ball metal layer (UBM) 29. The metal pillar 26 is disposed on the under ball metal layer (UBM) 29, and the under ball metal layer (UBM) 29 is disposed on the chip pad 22. In the embodiment, the under ball metal layer (UBM) 29 is a multi-layered structure, the material of the under ball metal layer (UBM) 29 includes aluminum (Al), titanium (Ti), nickel (Ni), vanadium (V) or copper (Cu), and the peripheral surface 261 of the metal pillar 26 is aligned with the peripheral surface 291 of the under ball metal layer (UBM) 29. As shown in FIG. 7, the solder 27 is heated, so that the solder 27 is melted and becomes a hemisphere due to the cohesion force. The maximum diameter formed by the solder 27 is shorter than or equal to the diameter of the metal pillar 26. Preferably, the height of the solder 27 is shorter than or equal to the radius of the metal pillar 26.

FIG. 7 shows a cross-sectional view of a chip having a metal pillar structure according to the first embodiment of the present invention. The chip 2 having a metal pillar structure comprises a chip body 21, at least one chip pad 22, a first passivation layer 23, an under ball metal layer (UBM) 29 and at least one metal pillar structure 28. The chip body 21 has an active surface 211. The chip pad 22 is disposed on the active surface 211. The first passivation layer 23 is disposed on the active surface 211, and has at least one first opening 231 so as to expose part of the chip pad 22. The under ball metal layer (UBM) 29 is disposed on the chip pad 22, and the under ball metal layer (UBM) 29 has a peripheral surface 291. In the embodiment, the under ball metal layer (UBM) 29 is a multi-layered structure, and the material of the under ball metal layer (UBM) 29 includes aluminum (Al), titanium (Ti), nickel (Ni), vanadium (V) or copper (Cu).

The metal pillar structure 28 is disposed on the under ball metal layer (UBM) 29, and comprises a metal pillar 26 and a solder 27. The metal pillar 26 is disposed on the under ball metal layer (UBM) 29, and has a peripheral surface 261. In the embodiment, the material of the metal pillar 26 is copper (Cu), the height of the metal pillar 26 has no limitation, and the peripheral surface 261 of the metal pillar 26 is aligned with the peripheral surface 291 of the under ball metal layer (UBM) 29. The solder 27 is disposed on the metal pillar 26, and the maximum diameter formed by the solder 27 is shorter than or equal to the diameter of the metal pillar 26. Therefore, the solder 27 is disposed in a phantom zone extending upward from the peripheral surface 261 of the metal pillar 26. Preferably, the solder 27 is a hemisphere, and the height of the solder 27 is shorter than or equal to the radius of the metal pillar 26. In the present invention, the distance between the central axes of two adjacent metal pillar structures 28 is defined as a pitch D (FIG. 8), and the pitch D is less than or equal to 150 μm, that is, the pitch between two adjacent metal pillar structures 28 of the chip 2 is a fine pitch.

Figure 9:
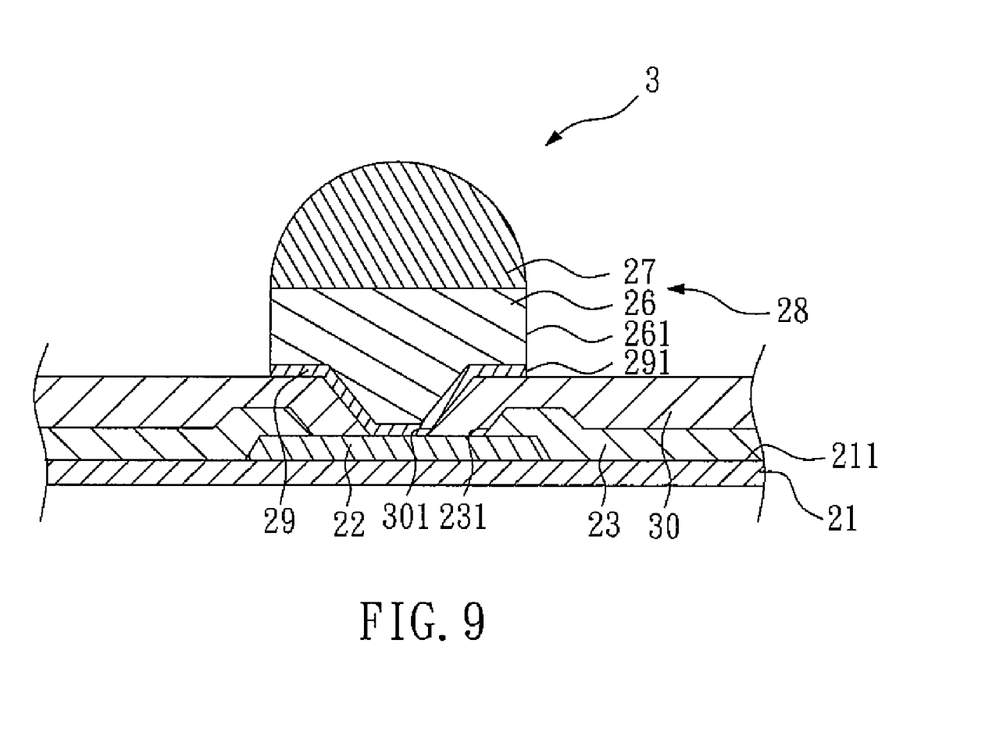
FIG. 9 is a cross-sectional view of a chip having a metal pillar structure according to a second embodiment of the present invention.

FIG. 9 shows a cross-sectional view of a chip having a metal pillar structure according to a second embodiment of the present invention. The chip 3 having a metal pillar structure according to the second embodiment is substantially the same as the chip 2 (FIG. 2) having a metal pillar structure according to the first embodiment, and the same elements are designated by the same reference numbers. The difference between the chip 3 and the chip 2 is that the chip 3 further comprises a second passivation layer 30. The second passivation layer 30 is disposed on the first passivation layer 23, and has at least one second opening 301 so as to expose part of the chip pad 22. In the embodiment, the material of the second passivation layer 30 is polyimide (PI), and the second opening 301 of the second passivation layer 30 is smaller than the first opening 231 of the first passivation layer 23. The under ball metal layer (UBM) 29 is disposed on the chip pad 22, and covers part of the second passivation layer 30.

Figure 10:
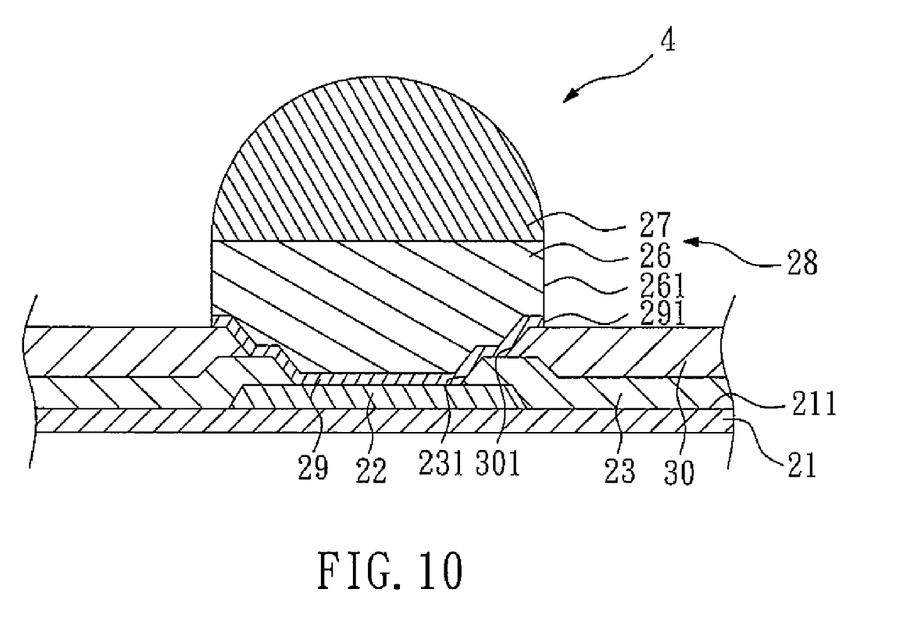
FIG. 10 is a cross-sectional view of a chip having a metal pillar structure according to a third embodiment of the present invention.
Figure 11:
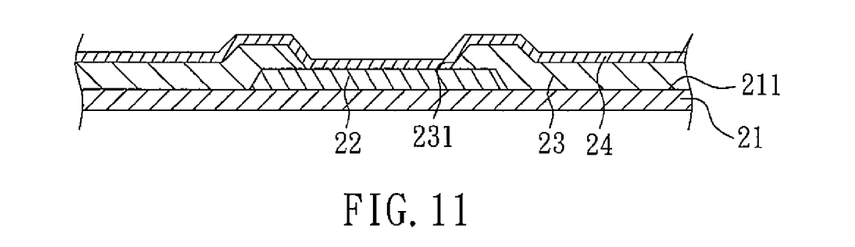
FIGS. 11 to 17 are schematic views of a method for making a chip having a metal pillar structure according to a fourth embodiment of the present invention.
Figure 12:
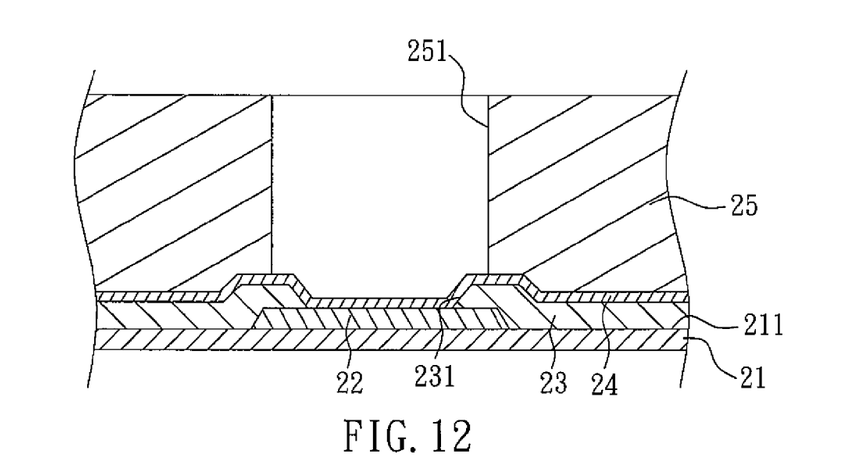
Figure 13:
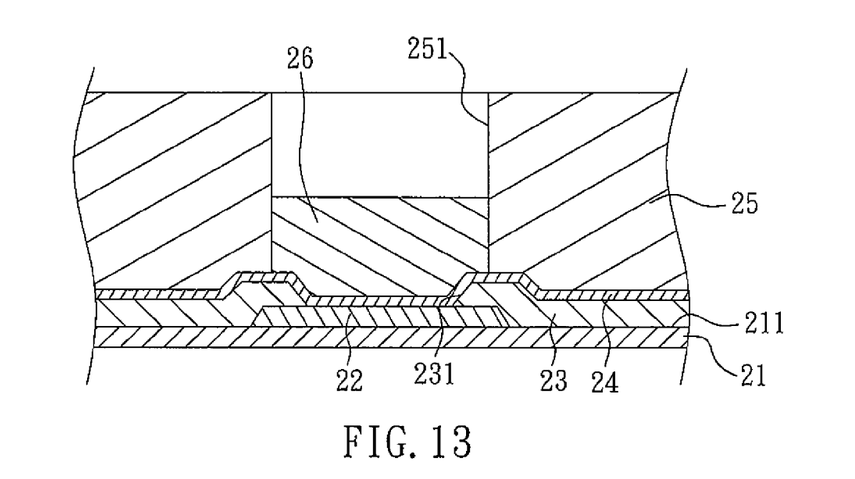
Figure 14:
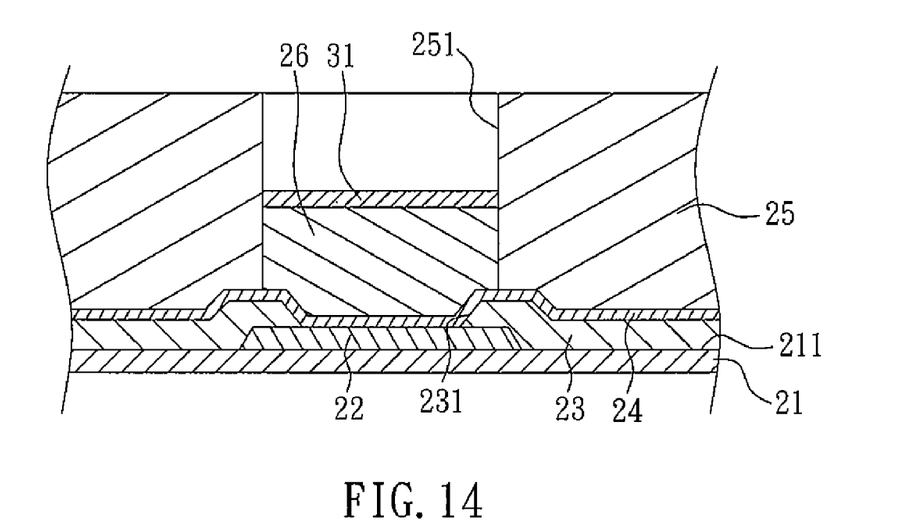
Figure 15:
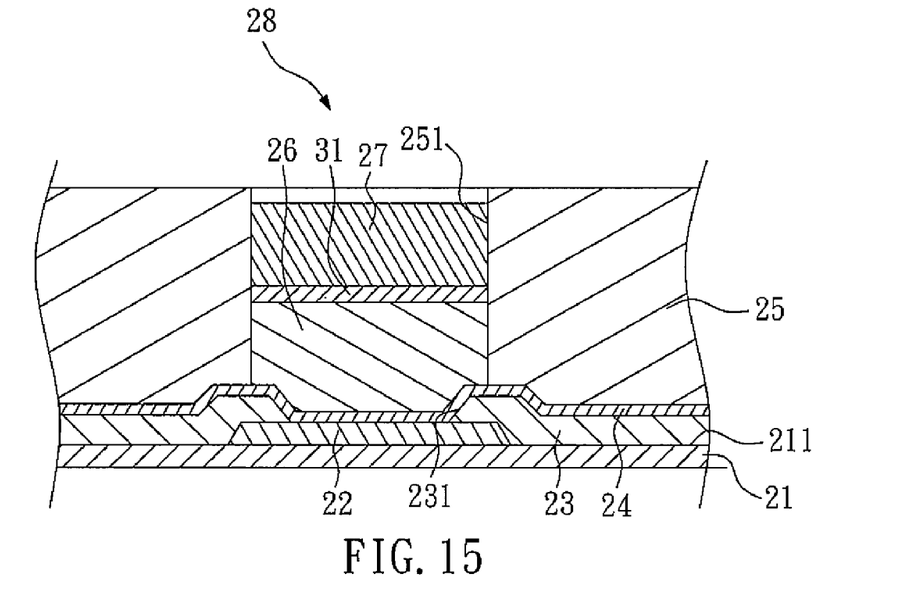
Figure 16:
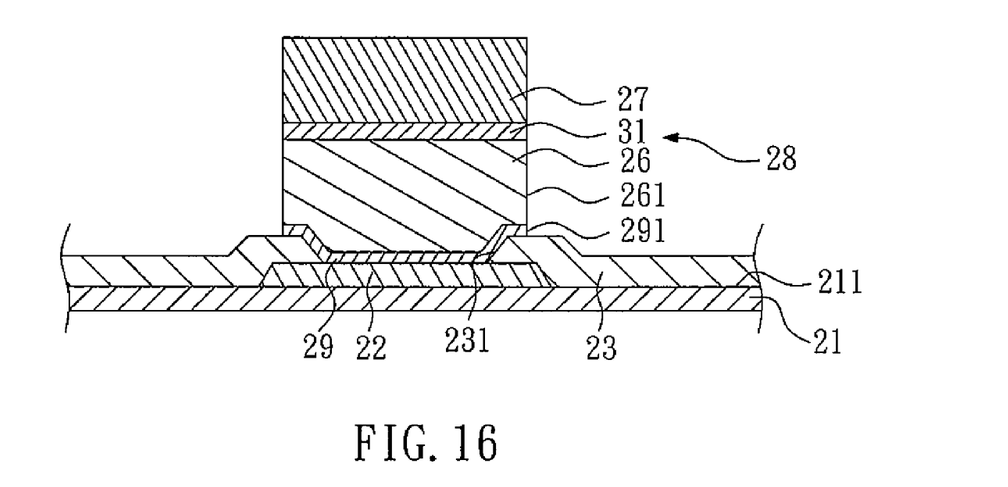

FIG. 10 shows a cross-sectional view of a chip having a metal pillar structure according to a third embodiment of the present invention. The chip 4 having a metal pillar structure according to the third embodiment is substantially the same as the chip 3 (FIG. 9) having a metal pillar structure according to the second embodiment, and the same elements are designated by the same reference numbers. The difference between the chip 4 and the chip 3 is that the second opening 301 of the second passivation layer 30 is larger than the first opening 231 of the first passivation layer 23, so as to expose part of the chip pad 22 and part of the first passivation layer 23. The under ball metal layer (UBM) 29 is disposed on the chip pad 22, and covers part of the first passivation layer 23 and part of the second passivation layer 30.

In the present invention, when the pitch between two adjacent metal pillar structures 28 of the chips 2, 3, 4 is a fine pitch, the defect of solder bridge can be avoided, so that the yield rate is improved.

FIGS. 11 to 17 show schematic views of a method for making a chip having a metal pillar structure according to a fourth embodiment of the present invention. The method according to the fourth embodiment is substantially the same as the method (FIGS. 2 to 8) according to the first embodiment, and the same elements are designated by the same reference numbers. The difference between the method according to the fourth embodiment and the method according to the first embodiment is that after a metal pillar 26 is formed, a barrier layer 31 is further formed on the metal pillar 26, and the material of the barrier layer 31 is nickel (Ni). Then, a solder 27 is formed on the barrier layer 31. The metal pillar 26, the barrier layer 31 and the solder 27 form a metal pillar structure 28.

Figure 17:
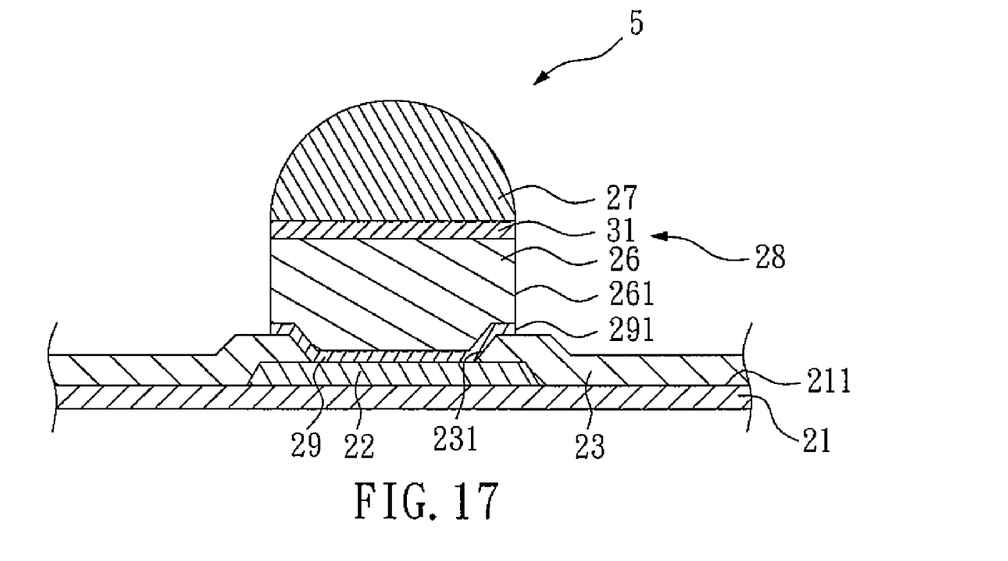

FIG. 17 shows a cross-sectional view of a chip having a metal pillar structure according to a fourth embodiment of the present invention. The chip 5 having a metal pillar structure is substantially the same as the chip 2 (FIG. 7) having a metal pillar structure according to the first embodiment, and the same elements are designated by the same reference numbers, as shown in FIGS. 2 to 7. The difference between the chip 5 and the chip 2 is that the metal pillar structure 28 further comprises a barrier layer 31 disposed on the metal pillar 26. The solder 27 is disposed on the barrier layer 31, and a preferably material of the barrier layer 31 is nickel (Ni). Whereby, the barrier layer 31 prevents the solder 27 from penetrating the upper part of the metal pillar 26 and forming an intermetallic layer having weak strength. Therefore, the reliability of the metal pillar structure 28 is increased.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A chip having a metal pillar structure, comprising:
a chip body, having an active surface;
at least one chip pad, disposed on the active surface;
a first passivation layer, disposed on the active surface, and having at least one first opening so as to expose part of the chip pad;
an under ball metal layer (UBM), disposed on the chip pad; and
at least one metal pillar structure, disposed on the under ball metal layer (UBM), comprising:
a metal pillar, disposed on the under ball metal layer (UBM); and
a solder, disposed on the metal pillar, wherein the maximum diameter formed by the solder is shorter than or equal to the diameter of the metal pillar,
further comprising a second passivation layer, wherein the second passivation layer is disposed on the first passivation layer and has at least one second opening so as to expose part of the chip pad.

2. The chip as claimed in claim 1, wherein the distance between the central axes of two adjacent metal pillar structures is defined as a pitch, and the pitch is less than or equal to 150 μm.

3. The chip as claimed in claim 1, wherein the metal pillar structure further comprises a barrier layer disposed on the metal pillar, and the solder is disposed on the barrier layer.

4. The chip as claimed in claim 1, wherein the peripheral surface of the metal pillar is aligned with the peripheral surface of the under ball metal layer (UBM).

5. The chip as claimed in claim 1, wherein the height of the solder is shorter than or equal to the radius of the metal pillar.

6. The chip as claimed in claim 1, wherein the second opening of the second passivation layer is smaller than the first opening of the first passivation layer.

7. The chip as claimed in claim 1, wherein the second opening of the second passivation layer is larger than the first opening of the first passivation layer, and the second opening further exposes part of the first passivation layer.

8. A chip having a metal pillar structure, comprising:
   a chip body, having an active surface;
   at least one chip pad, disposed on the active surface;
   a first passivation layer, disposed on the active surface, and having at least one first opening so as to expose part of the chip pad;
   a second passivation layer, disposed on the first passivation layer, and having at least one second opening so as to expose part of the chip pad;
   an under ball metal layer (UBM), disposed on the chip pad and extending along a sidewall defined by the second opening of the second passivation layer; and
   at least one metal pillar structure, disposed on the under ball metal layer (UBM), comprising:
      a metal pillar, disposed on the under ball metal layer (UBM); and
      a solder, extending upwardly from the metal pillar, wherein the height of the solder is smaller than or equal to the radius of the metal pillar.

9. The chip as claimed in claim 8, wherein the maximum diameter of the solder is smaller than or equal to the diameter of the metal pillar.

10. The chip as claimed in claim 8, wherein the distance between the central axes of two adjacent metal pillar structures is defined as a pitch, and the pitch is less than or equal to 150 μm.

11. The chip as claimed in claim 8, wherein the metal pillar structure further comprises a barrier layer disposed between the solder and the metal pillar, and the barrier layer comprises nickel (Ni).

12. The chip as claimed in claim 8, wherein a portion of the under ball metal layer (UBM) is disposed on an upper surface of the second passivation layer.

13. The chip as claimed in claim 8, wherein the solder has a hemispherical shape.

14. The chip as claimed in claim 8, wherein the second opening of the second passivation layer is smaller than the first opening of the first passivation layer.

15. A semiconductor device, comprising:
   a chip comprising a pad disposed on an active surface of the chip;
   a first passivation layer disposed on the active surface, and having a first opening exposing the pad;
   a second passivation layer disposed over the first passivation layer, and having a second opening exposing the pad;
   a metal pillar disposed at least partially within the first opening and the second opening, and electrically connected to the pad; and
   a solder disposed over an upper surface of the metal pillar.

16. The chip as claimed in claim 15, wherein a diameter of the first opening is greater than a diameter of the second opening.

17. The chip as claimed in claim 15, further comprising a metal layer disposed between the pad and the metal pillar, wherein the metal layer has a different composition than the pad and the metal pillar.

18. The chip as claimed in claim 15, further comprising a metal layer disposed between the metal pillar and the solder, wherein the metal layer has a different composition than the metal pillar and the solder.

19. The chip as claimed in claim 18, wherein outer perimeters of the metal pillar, the metal layer, and the solder are substantially aligned.

20. The chip as claimed in claim 15, wherein the solder has a hemispherical shape, and the height of the solder is less than the height of the metal pillar.

* * * * *